(12) United States Patent
Su et al.

(10) Patent No.: US 7,375,590 B2
(45) Date of Patent: May 20, 2008

(54) SINGLE-ENDED INPUT TO DIFFERENTIAL-ENDED OUTPUT LOW NOISE AMPLIFIER IMPLEMENTED WITH CASCODE AND CASCADE TOPOLOGY

(75) Inventors: Jiong-Guang Su, Keelung (TW); Tsyr-Shyang Liou, Taoyuan County (TW); Ja-Hao Chen, Taipei Hsien (TW); Chih-Wei Chen, Taipei (TW); Shao-Hua Chen, Taipei (TW); Han-Hau Wu, Taipei Hsien (TW)

(73) Assignee: Richwave Technology Corp., NeiHu District, Taipei (TW)

( * ) Notice: Subject to any disclaimer, the term of this patent is extended or adjusted under 35 U.S.C. 154(b) by 175 days.

(21) Appl. No.: 11/276,830

(22) Filed: Mar. 15, 2006

(65) Prior Publication Data
US 2007/0188238 A1  Aug. 16, 2007

(30) Foreign Application Priority Data
Feb. 14, 2006  (TW)  ............................. 95104956 A

(51) Int. Cl.
H03F 3/45  (2006.01)

(52) U.S. Cl. ...................................... 330/301; 330/253
(58) Field of Classification Search ................ 330/301, 330/283
See application file for complete search history.

(56) References Cited

U.S. PATENT DOCUMENTS

| 5,889,432 | A | * | 3/1999 | Ho ............................. 330/253 |
| 5,945,878 | A | * | 8/1999 | Westwick et al. ........... 330/301 |
| 6,608,527 | B2 | * | 8/2003 | Moloudi et al. ............. 330/301 |
| 7,099,646 | B1 | * | 8/2006 | Jin et al. ..................... 455/313 |
| 7,102,437 | B2 | * | 9/2006 | Perry .......................... 330/259 |

* cited by examiner

*Primary Examiner*—Robert Pascal
*Assistant Examiner*—Alan Wong
(74) *Attorney, Agent, or Firm*—Winston Hsu

(57) ABSTRACT

A low noise amplifier has the properties of low noise figure and high gain under a high-frequency operation. The low noise amplifier includes a first transistor, a first inductive impedance, a first gate voltage source, a matching circuit, an input, a second inductive impedance, a second transistor, a first capacitive impedance, a second gate voltage source, a third transistor, a third gate voltage source, a second capacitive impedance, a first impedance, a second impedance, a direct current source, a first output, a second output, a first resistor, a second resistor, a third resistor, a first bulk voltage source, a second bulk voltage source, and a third bulk voltage source.

16 Claims, 7 Drawing Sheets

SINGLE-ENDED INPUT TO DIFFERENTIAL-ENDED OUTPUT LOW NOISE AMPLIFIER IMPLEMENTED WITH CASCODE AND CASCADE TOPOLOGY

BACKGROUND OF THE INVENTION

1. Field of the Invention

The present invention relates to a low noise amplifier, and more particularly, to a single-ended input to differential-ended output low noise amplifier implemented with cascode and cascade topology.

2. Description of the Prior Art

A low noise amplifier is part of a receiver in a communication system and providing functions of amplifying received signals and suppressing noise figure of the receiver while designing a receiver of a general communication system. A conventional low noise amplifier is implemented with a single-ended input to single-ended output structure. However, a mixer connected to the conventional low noise amplifier has to be a single-ended input mixer because of the single-ended input to single-ended output structure so that common mode noises of the mixer and signals transmitted from a local oscillator and downconverted by the mixer to intermediated frequency (so called LO to IF feedthrough) cannot be efficiently reduced.

While designing a differential-ended output low noise amplifier, a differential-ended input to differential-ended output low noise amplifier would be conventional. However, a balun (balanced-to-unbalanced) has to be added in a previous stage of the differential-ended input to differential-ended output low noise amplifier so that a single-ended input signal received at the balun is transformed into a differential-ended output signal. The balun not only increases cost of implementing a low noise amplifier but also increases the noise figure of a corresponding receiver since the increase of the noise figure is generated from loss of the balun.

Please refer to FIG. 1, which is a diagram of a prior art low noise amplifier 100 having a single-ended input to differential-ended output structure, the low noise amplifier 100 implemented with a passive transformer. As shown in FIG. 1, the low noise amplifier 100 comprises a balun 102, a first transistor 110, a dc (direct current) current source 112, a second transistor 114, a first output matching impedance 116, a second output matching impedance 118, a first output 120, and a second output 122. The balun 102 comprises a first coil 104, a second coil 106, and an input 108. The gate of the first transistor 110 is coupled to a first terminal of the second coil 106. The dc current source 112 is coupled to the source of the first transistor 110. The gate of the second transistor 114 is coupled to a second terminal of the second coil 106. The source of the second transistor 114 is coupled to the dc current source 112. The first output matching impedance 116 is coupled to the drain of the first transistor 110. The second output matching impedance 118 is coupled to the drain of the second transistor 114. The first output 120 is coupled to the drain of the first transistor 110. The second output 122 is coupled to the drain of the second transistor 114. The differential-ended output structure of the low noise amplifier 100 is formed by both the first output 120 and the second output 122. The first coil 104 and the second coil 106 of the balun 102 are formed from wires of a corresponding integrated circuit. A signal having a phase difference equivalent to 180 degrees is generated from both the first coil 104 and the second coil 106 and transmitted to both the first transistor 110 and the second transistor 114. Then both the first transistor 110 and the second transistor 114 amplify the signal for generating a high frequency signal.

Please refer to FIG. 2, which is a diagram of a prior art low noise amplifier 200, and one of the differential transistors of the low noise amplifier 200 is grounded. As shown in FIG. 2, the low noise amplifier 200 comprises a first input matching impedance 202, an input 208, a first transistor 210, a dc current source 212, a second transistor 214, a second input matching impedance 204, a first output matching impedance 216, a second output matching impedance 218, a first output 220, and a second output 222. The output 208 is coupled to a first terminal of the first input matching impedance 202. The gate of the first transistor 210 is coupled to a second terminal of the first input matching impedance 202. The dc current source 212 is coupled to the source of the first transistor 210. The source of the second transistor 214 is coupled to the dc current source 212. The second input matching impedance 204 is coupled to the gate of the second transistor 214. The first output matching impedance 216 is coupled to the drain of the first transistor 210. The second output matching impedance 218 is coupled to the drain of the second transistor 214. The first output 220 is coupled to the drain of the first transistor 210. The second output 222 is coupled to the drain of the second transistor 214. The differential-ended output structure of the low noise amplifier 200 is formed by both the first output 220 and the second output 222. As shown in FIG. 2, one of the differential transistors of the low noise amplifier 200 is grounded, thereby, compared to the low noise amplifier 100 shown in FIG. 1, the low noise amplifier 200 saves the space of the balun 102 shown in FIG. 1 and decreases the loss generated from the balun 102. However, under high frequency, parasitic effects of elements are obvious. Therefore, the operations of the first transistor 210 and the second transistor 214 reveal a poor symmetry.

The primary component of both the low noise amplifiers 100 and 200 is the differential transistors. Therefore, under the same voltage supply, current of the dc current source 112 equals to the sum of the currents of the first transistor 110 and the second transistor 114, and current of the dc current source 212 equals to the sum of the currents of the first transistor 210 and the second transistor 214.

Please refer to FIG. 3, which is a diagram of a prior art low noise amplifier 300 having a single-ended input to differential-ended output structure. The low noise amplifier 300 comprises a first transistor 302, a first inductor 304, a second transistor 306, a second inductor 308, a first capacitor 310, a third transistor 312, a fourth transistor 314, a second capacitor 316, a first inductive impedance 318, a second inductive impedance 320, a third capacitor 322, a fourth capacitor 324, an input 326, a bias input 328, a first output 330, and a second output 332. The first inductor 304 has a first terminal coupled to the emitter of the first transistor 302 and a second terminal coupled to ground. The second inductor 308 has a first terminal coupled to the emitter of the second transistor 306 and a second terminal coupled to ground. The first capacitor 310 has a first terminal coupled to the collector of the first transistor 302 and a second terminal coupled to the base of the second transistor 306. The emitter of the third transistor 312 is coupled to the collector of the first transistor 302. The emitter of the fourth transistor 314 is coupled to the collector of the second transistor 306. The second capacitor 316 has a first terminal coupled to the base of the third transistor 312 and the base of the fourth transistor 314, and has a second terminal coupled to ground. The first inductive impedance 318 has a first terminal coupled to the collector of the third transistor 312 and a second terminal coupled to the dc voltage source VDD. The second inductive impedance 320 has a first terminal coupled to the collector of the fourth transistor 314 and a second terminal coupled to the dc voltage source VDD. The third capacitor 322 has a first terminal coupled to the collector of the third transistor 312. The fourth capacitor 324 has a first terminal coupled to the collector of the fourth transistor 314. The input 326 is coupled to the base of the first transistor 302. The bias input 328 is coupled to the base of the third transistor 312 and the base of the fourth transistor 314. The first output 330 is coupled to the second terminal of the third capacitor 322. The second output 332 is coupled to a second terminal of the fourth capacitor 324. As shown in FIG. 3, an input signal is inputted from the input 326 and to the base of the first transistor 302. After being amplified by the first transistor 302, the amplified input signal splits into two routes at the node "A" shown in FIG. 3. One route passes through the second transistor 306 and the fourth transistor 314 to the second output 332. Since the second transistor 306 forms a common-emitter configuration, thereby, a phase difference of 180 degrees is generated between the input signal and the output signal of the second transistor 306. Another route passes through the third transistor 312 to the first output 330. Since the third transistor 312 forms a common-base configuration, thereby, the phase between the input signal and the output signal of the third transistor 312 is the same. It is concluded that the phase difference between the output signal at the first output 330 and the output signal at the second output 332 is 180 degrees.

SUMMARY OF THE INVENTION

The present invention provides a single-ended input to differential-ended output low noise amplifier implemented with cascode and cascade topology. The low noise amplifier comprises a first transistor, a first inductive impedance having a first terminal connected to the source of the first transistor and a second terminal coupled to ground, a first gate voltage source coupled to the gate of the first transistor, a matching circuit having a first terminal coupled to the gate of the first transistor and a second terminal coupled to ground, an input coupled to a third terminal of the matching circuit, a second inductive impedance having a first terminal connected to the drain of the first transistor, a second transistor, the source of the second transistor connected to a second terminal of the second inductive impedance, a first capacitive impedance having a first terminal connected to the drain of the first transistor and a second terminal connected to the gate of the second transistor, a second gate voltage source coupled to the gate of the second transistor, a third transistor, the source of the third transistor connected to the drain of the first transistor, a third gate voltage source coupled to the gate of the third transistor, a second capacitive impedance having a first terminal connected to the gate of the third transistor and a second terminal connected to ground, a first impedance having a first terminal connected to the drain of the second transistor, a second impedance having a first terminal connected to the drain of the third transistor, a direct current voltage source connected to a second terminal of the first impedance and a second terminal of the second impedance, a first output connected to the drain of the second transistor, and a second output connected to the drain of the third transistor.

These and other objectives of the present invention will no doubt become obvious to those of ordinary skill in the art after reading the following detailed description of the preferred embodiment that is illustrated in the various figures and drawings.

DETAILED DESCRIPTION

Figure 4:
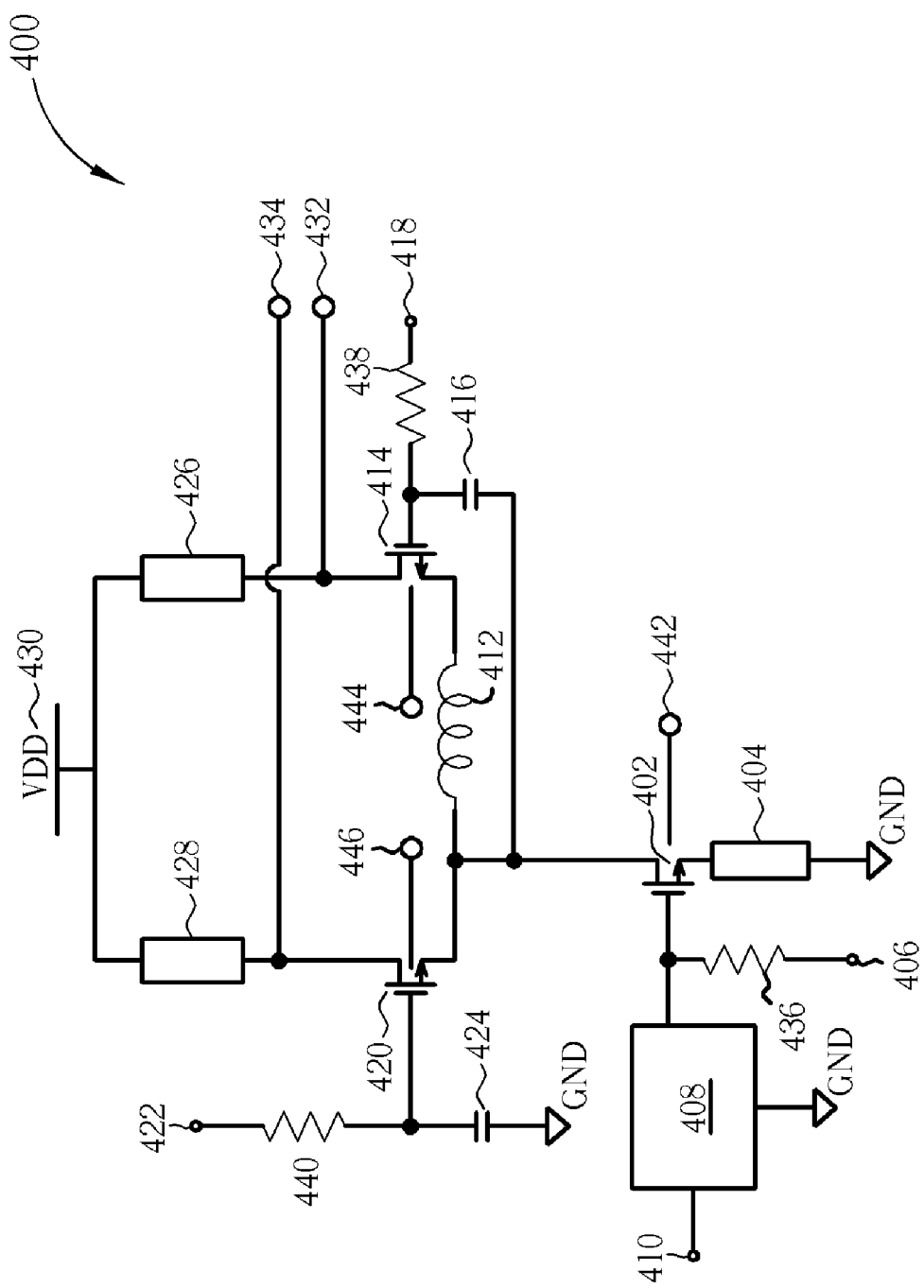
FIG. 4 is a diagram of a low noise amplifier having a single-ended input to differential-ended output structure of the present invention.

Please refer to FIG. 4, which is a diagram of a low noise amplifier 400 having a single-ended input to differential-ended output structure of the present invention. As shown in FIG. 4, the low noise amplifier 400 comprises a first transistor 402, a first inductive impedance 404, a first gate voltage source 406, a matching circuit 408, an input 410, a second inductive impedance 412, a second transistor 414, a first capacitive impedance 416, a second gate voltage source 418, a third transistor 420, a third gate voltage source 422, a second capacitive impedance 424, a first output impedance 426, a second output impedance 428, a dc voltage source 430, a first output 432, a second output 434, a first resistor 436, a second resistor 438, a third resistor 440, a first bulk voltage source 442, a second bulk voltage source 444, and a third bulk voltage source 446. The first inductive impedance 404 has a first terminal connected to the source of the first transistor 402 and a second terminal connected to ground. The first gate voltage source 406 is coupled to the gate of the first transistor 402. The matching circuit 408 has a first terminal coupled to the gate of the first transistor 402 and a second terminal coupled to ground. The input 410 is coupled to a third terminal of the matching circuit 408. The second inductive impedance 412 has a first terminal connected to the drain of the first transistor 402. The source of the second transistor 414 is connected to a second terminal of the second inductive impedance 412. The first capacitive impedance 416 has a first terminal connected to the drain of the first transistor 402 and a second terminal connected to the gate of the second transistor 414. The second gate voltage source 418 is coupled to the gate of the second transistor 414. The source of the third transistor 420 is connected to the drain of the first transistor 402. The third gate voltage source 422 is coupled to the gate of the third transistor 420. The second capacitive impedance 424 has a first terminal connected to the gate of the third transistor 420 and a second terminal connected to ground. The first output impedance 426 has a first terminal connected to the drain of the second transistor 414. The second output impedance 428 has a first terminal connected to the drain of the third transistor 420. The dc voltage source 430 is connected to a second terminal of the first output impedance 426 and a second terminal of the second output impedance 428. A first output 432 is connected to the drain of the second transistor 414. A second output 434 is connected to the drain of the third transistor 420. The first resistor 436 is connected to the gate of the first transistor 402 and the first gate voltage source 406. The second resistor 438 is connected to the gate of the second transistor 414 and the second gate voltage source 418. The third resistor 440 is connected to the gate of the third transistor 420 and the third gate voltage source 422. The first bulk voltage source 442 has a first terminal coupled to the bulk of the first transistor 402. The second bulk voltage source 444 has a first terminal coupled to the bulk of the second transistor 414. The third bulk voltage source 446 has a first terminal coupled to the bulk of the third transistor 420.

In FIG. 4, the first transistor 402, the second transistor 414, and the third transistor 420 are N-type metal oxide semiconductor field-effect transistors (MOSFET). The resistance of the first resistor 436, the second resistor 438, and the third resistor 440 is high so that the resistors are utilized for preventing signals from leaking from the gates of the transistors to neighboring bias circuits under a high frequency. The first inductive impedance 404 is utilized for part of impedance matching. The second inductive impedance 412 is utilized for segregating high frequency signals at the drain of the first transistor 402 from high frequency signals at the source of the second transistor 414 under a high frequency and conducting dc currents flowing between the drain of the first transistor 402 and the source of the second transistor 414. The first capacitive impedance 416 is utilized for conducting the high frequency signal from the drain of the first transistor 402 to the gate of the second transistor 414 and prohibiting dc currents from flowing between the drain of the first transistor 402 and the gate of the second transistor 414 under a high frequency. The second capacitive impedance 424 is utilized for setting the electrical level of the gate at a high frequency if the third transistor 420 to converge to ground without affecting the dc electrical level of the gate of the third transistor 420. The first output impedance 426 and the second output impedance 428 are the matching impedances utilized for serving as an output matching impedance, and the value of the output matching impedance may reach a desire value. The matching circuit 408 is a conventional matching circuit and can be implemented with various methods. The first bulk voltage source 442, the second bulk voltage source 444, and the third bulk voltage source 446 are dc voltage sources, each second terminal of the bulk voltage sources may be coupled to the source of the corresponding transistor, a dc voltage source, or ground according to requirements.

While the low noise amplifier 400 is under a high frequency, high frequency signals are inputted from the input 410 to the drain of the first transistor 402 through the matching circuit 408 and the first transistor 402. Because of inherent properties of the metal oxide semiconductor field-effect transistors, a phase difference of approximately 180 degrees is generated between the input signal and the output signal of the first transistor 402. The signals at the drain of the first transistor 402 are then transmitted to the gate of the second transistor 414 through the first capacitive impedance 416. Therefore, signals at the drain of the first transistor 402 have the same phase with the signals at the gate of the second transistor 414. Moreover, the second inductive impedance 412, which is connected to the drain of the first transistor 402 and the source of the second transistor 414, prevents high frequency signals at the drain of the first transistor 402 from reaching the drain of the second transistor 414 through the source of the second transistor 414 and the channel of the second transistor 414. The signals at the gate of the second transistor 414 are amplified to the drain of the second transistor 414, i.e., the first output 432, through the common-source configuration of the second transistor 414. Moreover, the amplified signals at the first output 432 have a phase difference of approximately 180 degrees with the signals at the gate of the second transistor 414 so that the signals at the input 410 have a phase difference of approximately 360 degrees with the signals at the first output 432, i.e., the signals at the input 410 have the same phase with the signals at the first output 432.

At the same time, the signals at the drain of the first transistor 402 are amplified to the drain of the third transistor 420, i.e., the second output 434, through the common-gate configuration of the third transistor 420. Because of the common-gate configuration of the third transistor 420 and the inherent properties of the medal oxide semiconductor field-effect transistors, the signals at the source of the third transistor 420 have the same phase with the signals at the drain of the third transistor 420, i.e., the signals at the source of the third transistor 420 have the same phase with the second output 434. Therefore, the signals at the input 410 have a phase difference of approximately 180 degrees with the signals at the second output 434 so that the signals at the first output 432 have a phase difference of approximately 180 degrees with the signals at the second output 434. A phase difference of 180 degrees is generated at both the outputs from the high frequency signals inputted at the input 410, thereby, a single-ended input to differential-ended output low noise amplifier is implemented.

In FIG. 4, the sizes and the bias voltages of the second transistor 414 and the third transistor 420 are not necessarily equivalent to each other. The required linearity, the required gain, and the phase difference of 180 degrees may be reached by adjusting the sizes and the bias voltages of the second transistor 414 and the third transistor 420.

Figure 1:
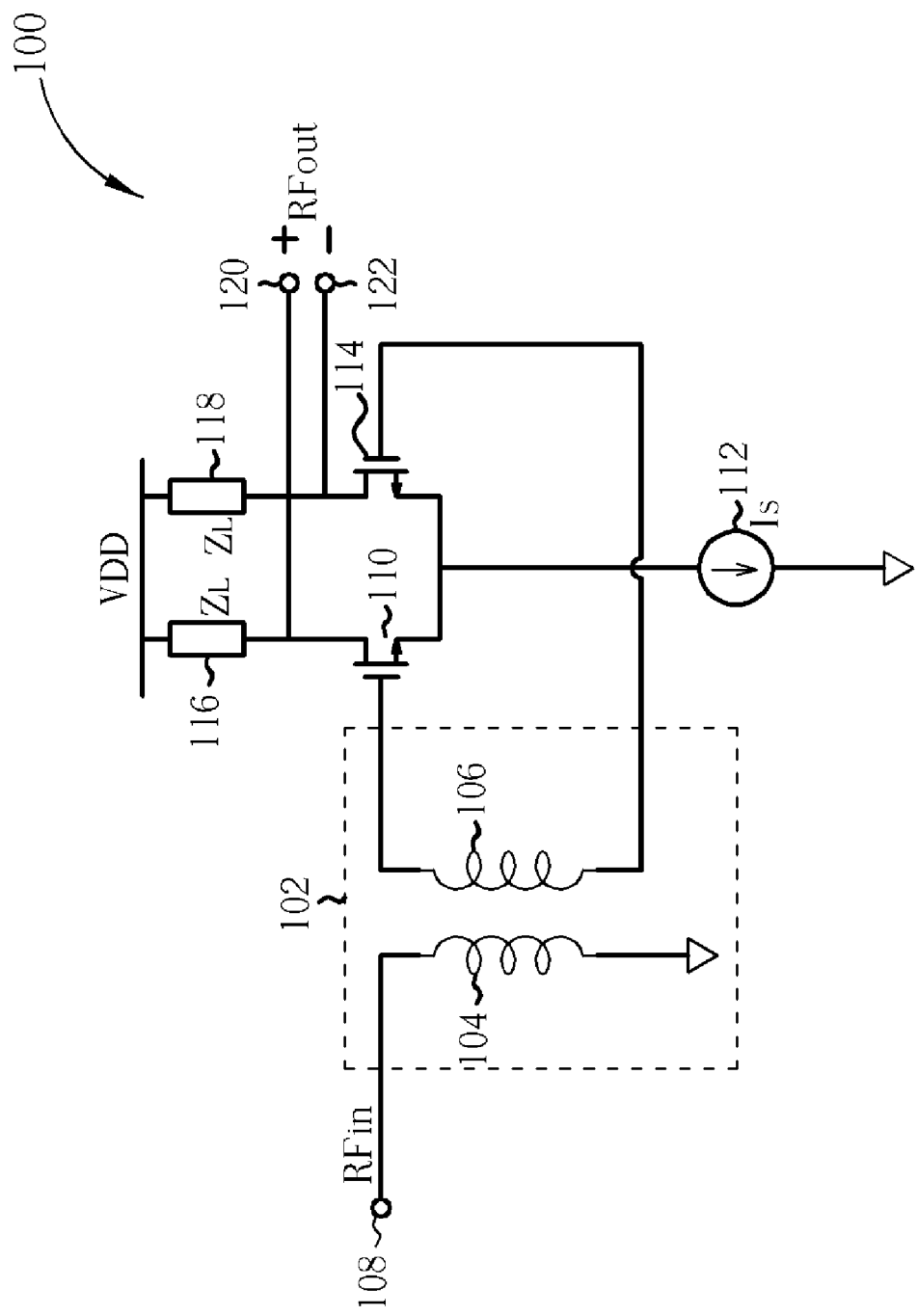
FIG. 1 is a diagram of a prior art low noise amplifier having a single-ended input to differential-ended output structure, and the low noise amplifier is implemented with a passive transformer.
Figure 2:
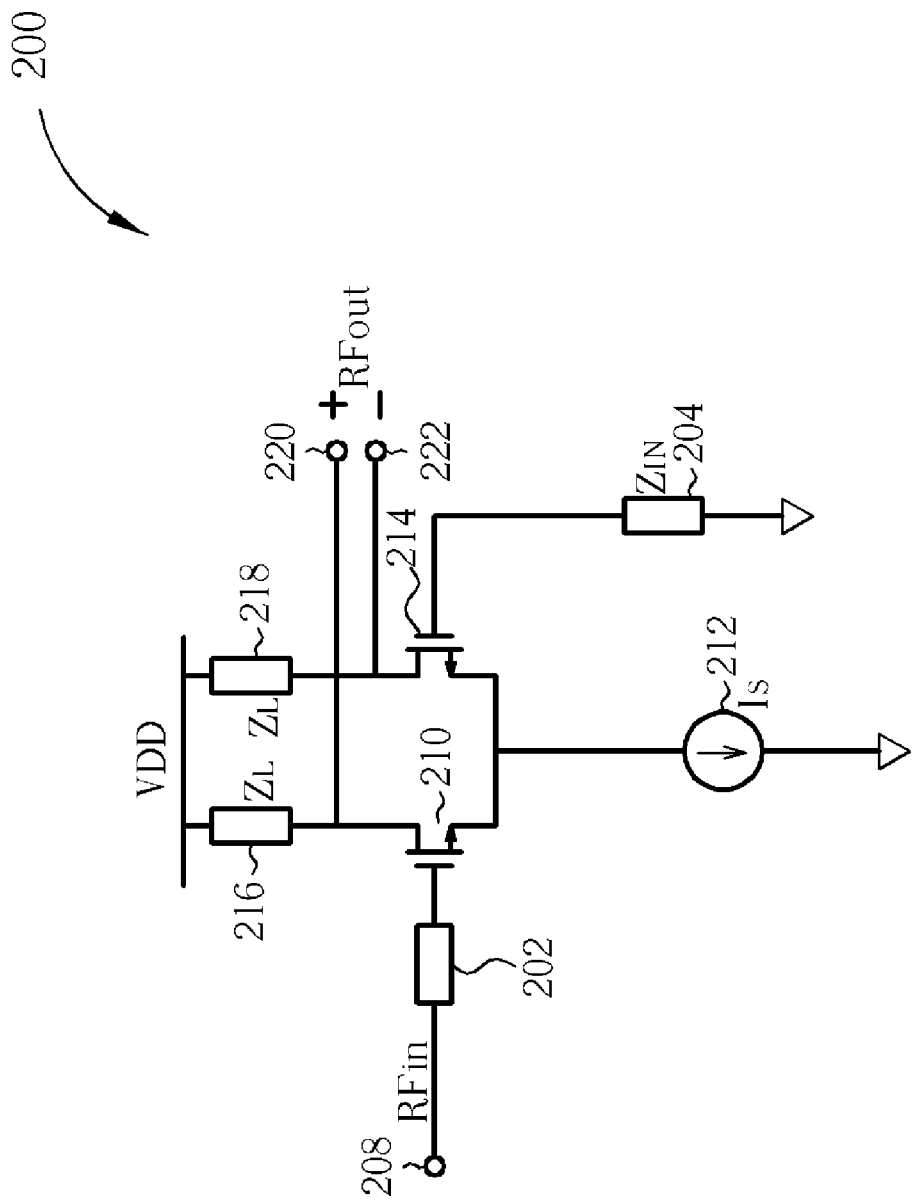
FIG. 2 is a diagram of a prior art low noise amplifier, and one of the differential transistors of the low noise amplifier is grounded.

Compared to the low noise amplifier 100 shown in FIG. 1, the low noise amplifier 400 not only saves the wires of the balun 102 of the low noise amplifier 100 but also has higher gain and lower noise figure under the same dc supply voltage and the same supply current with the low noise amplifier 100. Moreover, the combination of the transistors in the low noise amplifier 400 has the same two-stage cascode structure with the low noise amplifier 100 under the same dc voltage VDD, thereby, the linearity of the low noise amplifier 400 is not less than the linearity of the low noise amplifier 100.

Compared to the low noise amplifier 200, one of the differential transistors of the low noise amplifier 200 connected to ground, the low noise amplifier 400 has higher gain and lower noise figure than the low noise amplifier 200 under the same dc supply voltage and the same supply current. Moreover, since the first transistor 402 of the low noise amplifier 400 has a common-source configuration, the high frequency matching of the noise figure and the gain of the low noise amplifier 400 is more precise than the low noise amplifier 200, and the design complexity of the low noise amplifier 400 is also less than the low noise amplifier 200.

Figure 3:
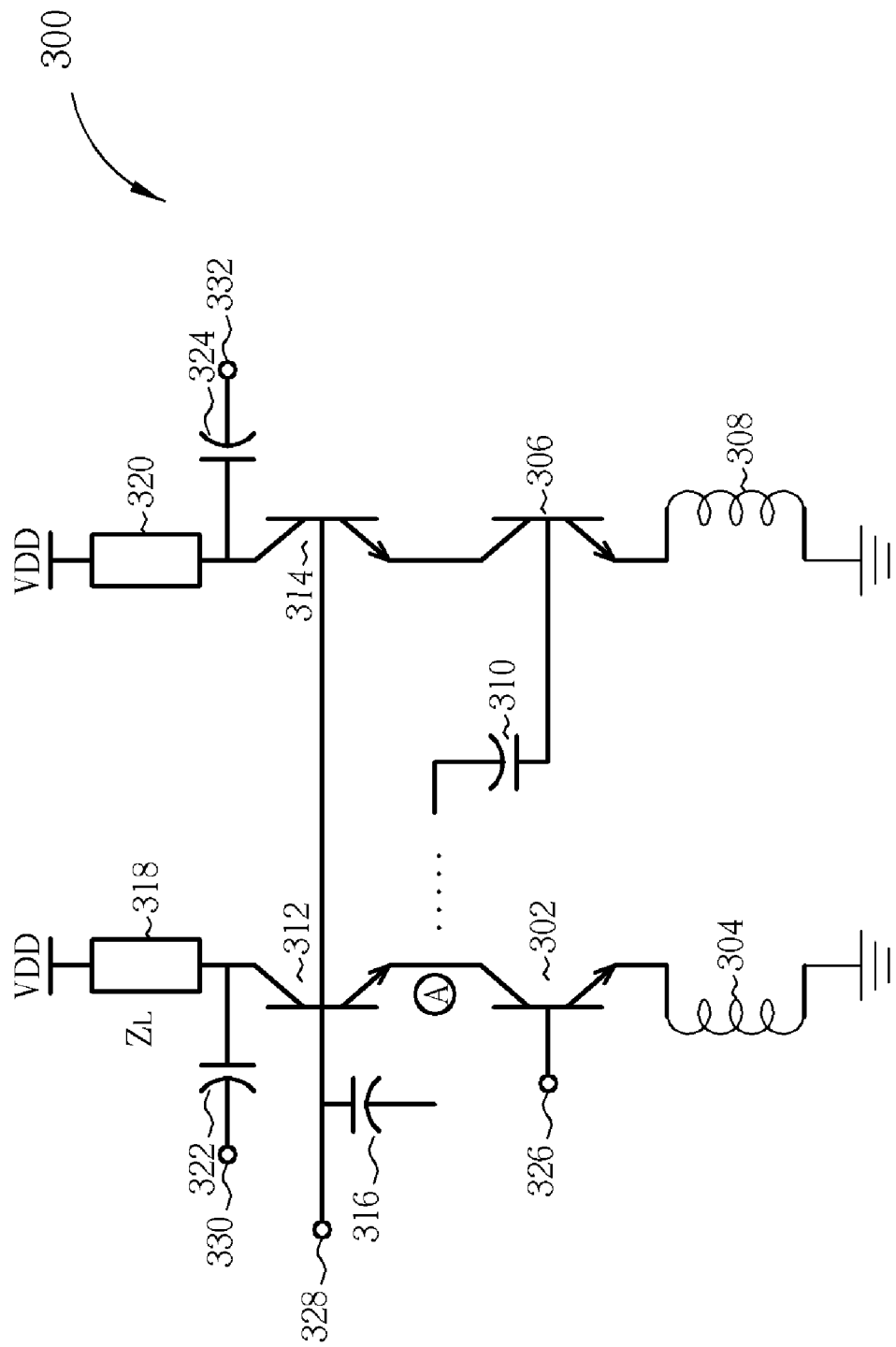
FIG. 3 is a diagram of a prior art low noise amplifier having a single-ended input to differential-ended output structure.

Compared to the single-ended input to differential-ended output low noise amplifier 300 shown in FIG. 3, the first transistor 402 of the low noise amplifier 400 has the same common-source configuration with the first transistor 302 of the low noise amplifier 300. Note that the first transistor 302 is a bipolar junction transistor, thereby, the configuration of the first transistor 302 is denoted as a common-emitter configuration. As a result, the high frequency matching of the gain and the noise figure of the low noise amplifier 400 is more precise and less complex than the low noise amplifier 300 shown in FIG. 3. However, in FIG. 3, the current flowing through the first transistor 302 is equal to the current flowing through the third transistor 312, and the current flowing through the second transistor 306 is equal to the current flowing through the fourth transistor 314, thereby, the current utilized by the low noise amplifier 300 is the sum of the currents flowing through the first transistor 302 and the second transistor 306. In the low noise amplifier 400 of the present invention, the current flowing through the first transistor 402 is the sum of the currents flowing through the second transistor 414 and the third transistor 420, thereby, the current flowing through the first transistor 402 is the current utilized by the low noise amplifier 400. Under identical dc current level of low noise amplifier, the first transistor 402 of the low noise amplifier 400 of the present invention has better noise figure and higher gain than the first transistor 302 of the low noise amplifier 300. The phenomenon that results is because the first transistor 402 of the low noise amplifier 400 loads more currents than the first transistor 302 of the noise amplifier 300 under the same dc current level of low noise amplifier. Moreover, for the output signals of the low noise amplifier 300, high frequency input signals are amplified by the first transistor 302, the second transistor 306, and the fourth transistor 314, thereby, the linearity of the low noise amplifier 300 is much limited because of the limited voltage swing. On the contrary, the output signals of the low noise amplifier 400 of the present invention are merely amplified by two stages of transistors, therefore, the linearity of the low noise amplifier 400 is not limited as much as the low noise amplifier 300.

Besides N-type metal oxide semiconductor field-effect transistors, the transistors utilized for implementing the low noise amplifier of the present invention may also be P-type metal oxide semiconductor field-effect transistors and bipolar junction transistors. The low noise amplifier 400 shown in FIG. 4 is merely a preferred embodiment of the present invention. It means that replacing any elements of the low noise amplifier of the present invention is still within the range of the present invention. Additionally, the low noise amplifier of the present invention is not limited by FIG. 4. The diagrams of FIG. 5, FIG. 6, and FIG. 7 illustrate other preferred embodiments of the present invention, and the embodiments merely replace some elements of the low noise amplifier 400 shown in FIG. 4.

Figure 5:
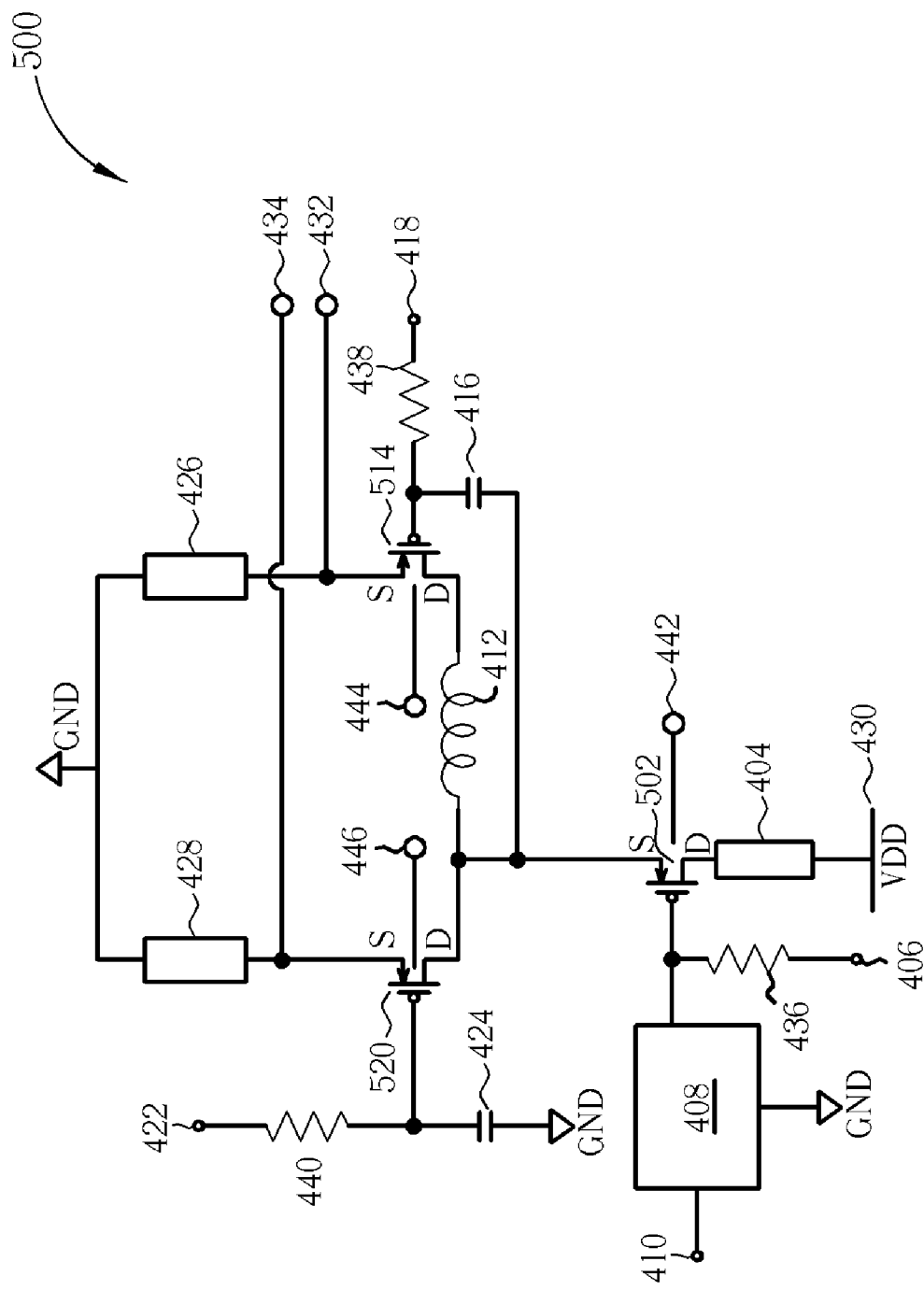
FIG. 5 is a diagram of a low noise amplifier implemented with P-type metal oxide semiconductor field-effect transistors of the present invention.

Please refer to FIG. 5, which is a diagram of a low noise amplifier 500 implemented with P-type metal oxide semiconductor field-effect transistors of the present invention. Except for exchanging the dc voltage source 430 and the ground with each other and replacing the N-type metal oxide semiconductor field-effect transistors of the low noise amplifier 400 with P-type metal oxide semiconductor field-effect transistors, the remaining disposition of the low noise amplifier 500 is almost the same with the low noise amplifier 400. It means that the transistors 402, 414, and 420 of the low noise amplifier 400 are replaced with transistors 502, 514, and 520 in the low noise amplifier 500. And the transistors 502, 514, and 520 are P-type metal oxide semiconductor field-effect transistors.

Figure 6:
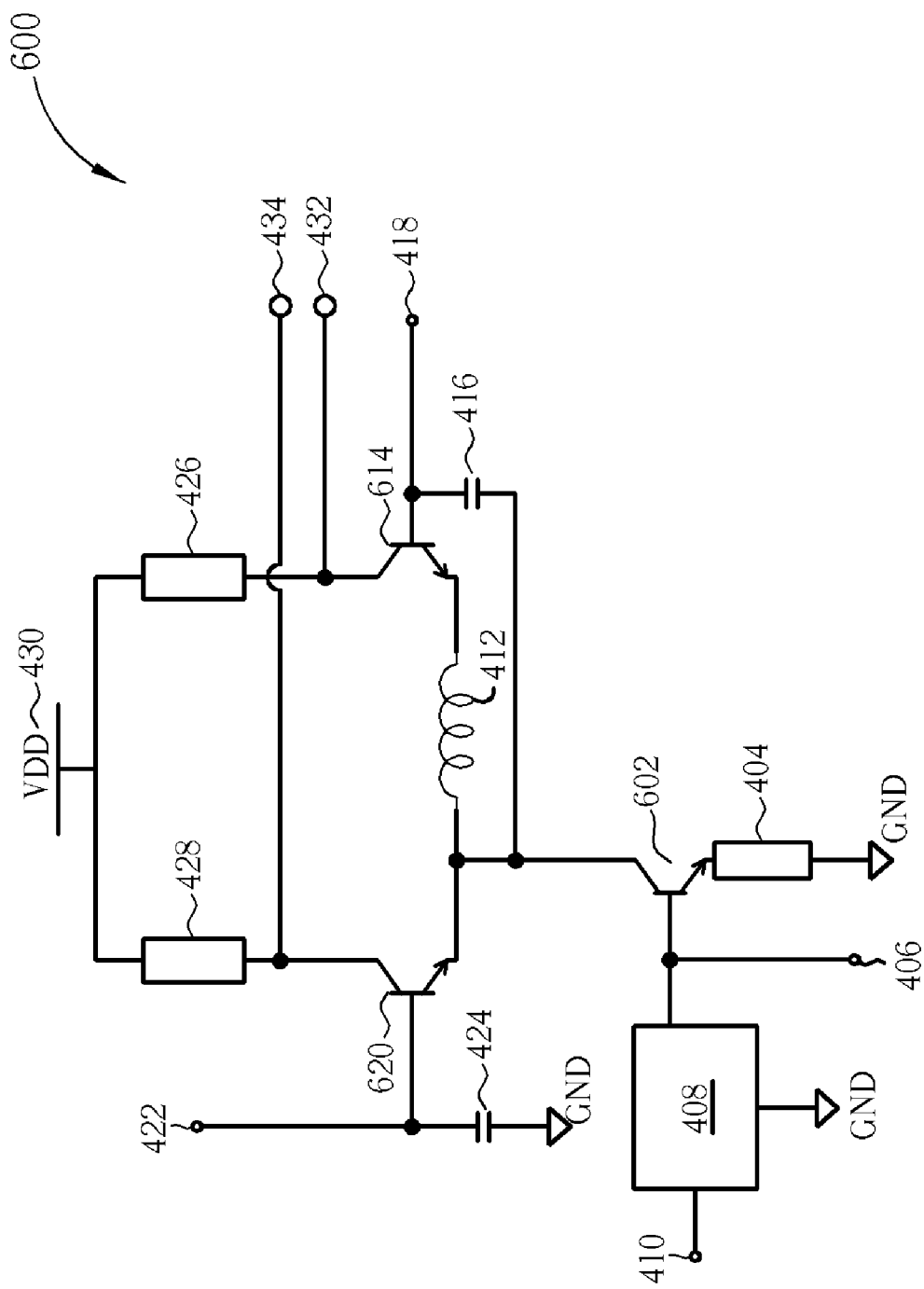
FIG. 6 is a diagram of the low noise amplifier implemented with NPN bipolar junction transistors.

Please refer to FIG. 6, which is a diagram of the low noise amplifier 600 implemented with NPN bipolar junction transistors (NPN BJT). Except for replacing the N-type metal oxide semiconductor field-effect transistors of the low noise amplifier 400 with NPN bipolarjunction transistors, the remaining disposition of the low noise amplifier 600 is almost the same with the low noise amplifier 400. It means that the transistors 402, 414, and 420 of the low noise amplifier 400 are replaced with the transistors 602, 614, and 620. The transistors 602, 614, and 620 are NPN bipolar junction transistors.

Figure 7:
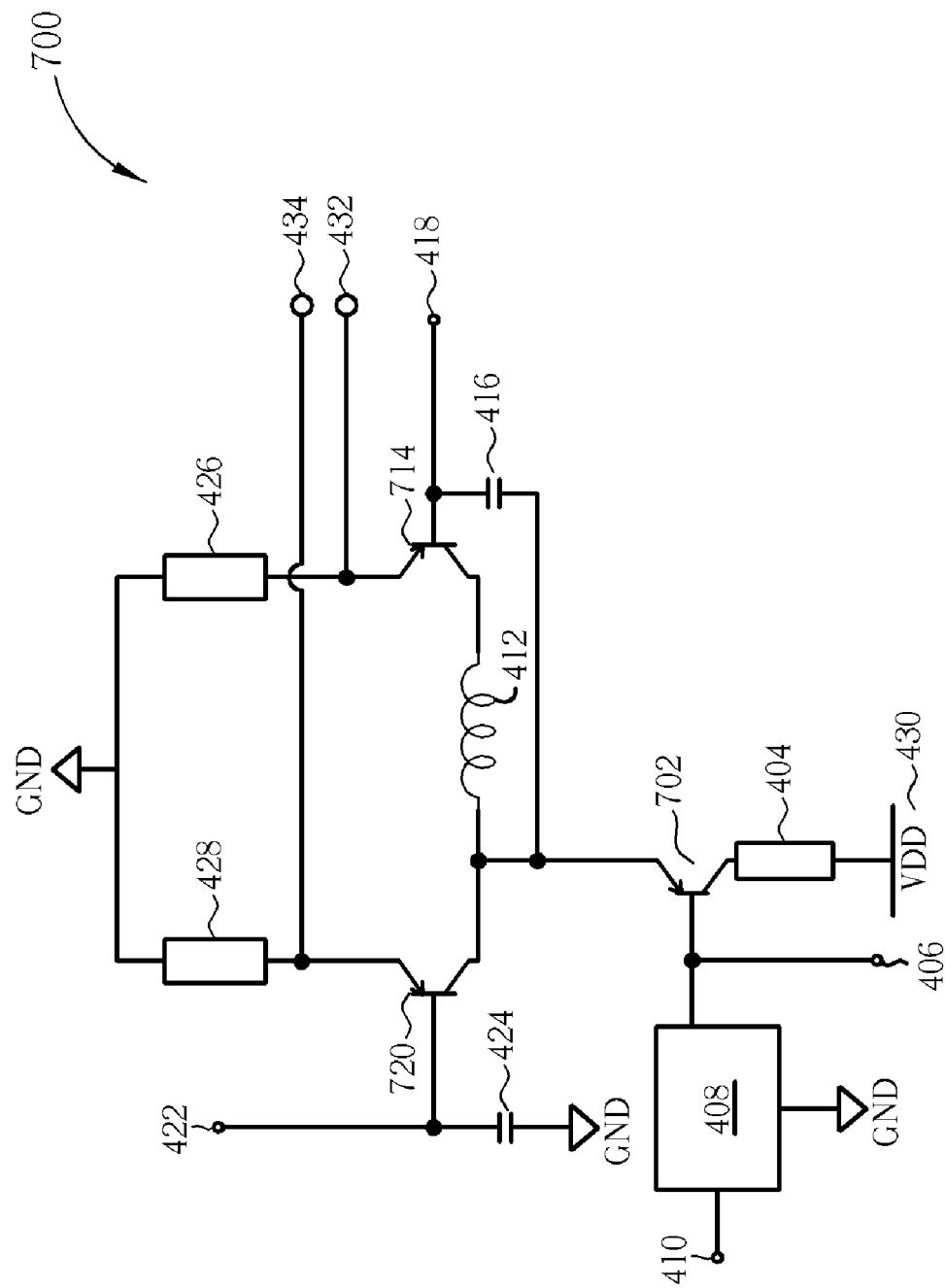
FIG. 7 is a diagram of the low noise amplifier implemented with PNP bipolar junction transistors

Please refer to FIG. 7, which is a diagram of the low noise amplifier 700 implemented with PNP bipolar junction transistors (PNP BJT). Except for exchanging the dc voltage source 430 and the ground with each other and replacing the N-type metal oxide semiconductor field-effect transistors of the low noise amplifier 400 with PNP bipolar junction transistors, the remaining disposition of the low noise amplifier 700 is almost the same with the low noise amplifier 400. It means that the transistors 402, 414, and 420 of the low noise amplifier 400 are replaced with the transistors 702, 714, and 720. The transistors 702, 714, and 720 are PNP bipolarjunction transistors.

A single-ended input and differential-ended output low noise amplifier is implemented with cascode and cascade topologies in the present invention. Under the same dc power consumption and the same high frequency, the low noise amplifier of the present invention has the advantage of high gain and low noise figure. More particularly, under a high frequency, related properties of the low noise amplifier of the present invention are designed more precisely than prior art low noise amplifiers. The linearity of the low noise amplifier of the present invention is the same with some or better than prior art low noise amplifiers.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A single-ended input to differential-ended output low noise amplifier implemented with cascode and cascade topology, the low noise amplifier comprising:
   a first transistor;
   a first inductive impedance having a first terminal connected to the source of the first transistor, and a second terminal coupled to ground;
   a first gate voltage source coupled to the gate of the first transistor;
   a matching circuit having a first terminal coupled to the gate of the first transistor;
   an input coupled to a third terminal of the matching circuit;
   a second inductive impedance having a first terminal connected to the drain of the first transistor;
   a second transistor, the source of the second transistor connected to a second terminal of the second inductive impedance;
   a first capacitive impedance having a first terminal connected to the drain of the first transistor, and a second terminal connected to the gate of the second transistor;
   a second gate voltage source coupled to the gate of the second transistor;
   a third transistor, the source of the third transistor connected to the drain of the first transistor;
   a third gate voltage source coupled to the gate of the third transistor;
   a second capacitive impedance having a first terminal connected to the gate of the third transistor, and a second terminal connected to ground;

a first output impedance having a first terminal connected to the drain of the second transistor;

a second output impedance having a first terminal connected to the drain of the third transistor;

a direct current voltage source connected to a second terminal of the first impedance and a second terminal of the second impedance;

a first output connected to the drain of the second transistor; and a second output connected to the drain of the third transistor.

2. The low noise amplifier of claim 1 wherein the first transistor, the second transistor, and the third transistor are N-type metal oxide semiconductors field-effect transistor.

3. The low noise amplifier of claim 2 wherein the bulk of the first transistor is connected to the source of the first transistor.

4. The low noise amplifier of claim 2 wherein the bulk of the second transistor is connected to the source of the second transistor, and the bulk of the third transistor is connected to the source of the third transistor.

5. The low noise amplifier of claim 1 wherein the bulk of the first transistor is connected to ground or a direct current voltage source.

6. The low noise amplifier of claim 1 wherein the bulk of the second transistor is connected to ground or a direct current voltage source, and the bulk of the third transistor is connected to ground or a direct voltage source.

7. The low noise amplifier of claim 2 further comprising:
a first resistor connected to the gate of the first transistor and the first gate voltage source;
a second resistor connected to the gate of the second transistor and the second gate voltage source; and
a third resistor connected to the gate of the third transistor and the third gate voltage source.

8. The low noise amplifier of claim 1 wherein the first transistor, the second transistor, and the third transistor are NPN bipolar junction transistors (NPN BJT).

9. A single-ended input to a differential-ended output low noise amplifier implemented with cascode and cascade topology, the low noise amplifier comprising:
a first transistor;
a first inductive impedance having a first terminal connected to the drain of the first transistor;
a first gate voltage source coupled to the gate of the first transistor;
a matching circuit having a first terminal coupled to the gate of the first transistor;
an input coupled to a second terminal of the matching circuit;
a second inductive impedance having a first terminal connected to the source of the first transistor;
a second transistor, the drain of the second transistor connected to the second terminal of the second inductive impedance;

a first capacitive impedance having a first terminal connected to the source of the first transistor, and a second terminal connected to the gate of the second transistor;

a second gate voltage source coupled to the gate of the second transistor;

a third transistor, the drain of the third transistor connected to the source of the first transistor;

a third gate voltage source coupled to the gate of the third transistor;

a second capacitive impedance having a first terminal connected to the gate of the third transistor;

a first impedance having a first terminal connected to the source of the second transistor, and a second terminal connected to ground;

a second impedance having a first terminal connected to the source of the third transistor, and a second terminal connected to ground;

a direct current voltage source connected to a second terminal of the first inductive impedance, a third terminal of the matching circuit, and a second terminal of the second capacitive impedance;

a first output connected to the source of the second transistor; and a second output connected to the source of the third transistor.

10. The low noise amplifier of claim 9 wherein the first transistor, the second transistor, and the third transistor are P-type metal oxide semiconductors field-effect transistor.

11. The low noise amplifier of claim 10 wherein the bulk of the first transistor is connected to the source of the first transistor.

12. The low noise amplifier of claim 10 wherein the bulk of the second transistor is connected to the source of the second transistor, and the bulk of the third transistor is connected to the source of the third transistor.

13. The low noise amplifier of claim 9 wherein the bulk of the first transistor is connected to ground or a direct current voltage source.

14. The low noise amplifier of claim 9 wherein the bulk of the second transistor is connected to ground or a direct current voltage source, and the bulk of the third transistor is connected to ground or a direct current voltage source.

15. The low noise amplifier of claim 10 further comprising:
a first resistor connected to the gate of the first transistor and the first gate voltage source;
a second resistor connected to the gate of the second transistor and the second gate voltage source; and
a third resistor connected to the gate of the third transistor and the third gate voltage source.

16. The low noise amplifier of claim 9 wherein the first transistor, the second transistor, and the third transistor are PNP bipolar junction transistors (PNP BJT).

* * * * *